(12) United States Patent
Wu

(10) Patent No.: US 9,116,297 B2
(45) Date of Patent: Aug. 25, 2015

(54) COLOR FILTER SUBSTRATE, MANUFACTURING METHOD THEREOF AND LIQUID CRYSTAL PANEL

(71) Applicant: Shenzhen China Star Optoelectronics Technology Co., Ltd., Shenzhen, Guangdong (CN)

(72) Inventor: Chun-ming Wu, Shenzhen (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 204 days.

(21) Appl. No.: 13/811,688

(22) PCT Filed: Jan. 11, 2013

(86) PCT No.: PCT/CN2013/070384
§ 371 (c)(1),
(2) Date: Jan. 23, 2013

(87) PCT Pub. No.: WO2014/107890
PCT Pub. Date: Jul. 17, 2014

(65) Prior Publication Data
US 2014/0192301 A1  Jul. 10, 2014

(51) Int. Cl.
G02F 1/1339 (2006.01)
G02F 1/1335 (2006.01)
G02B 5/22 (2006.01)
G03F 7/00 (2006.01)
G02B 5/20 (2006.01)

(52) U.S. Cl.
CPC ........ *G02B 5/22* (2013.01); *G02B 5/201* (2013.01); *G02F 1/13394* (2013.01); *G02F 1/133516* (2013.01); *G03F 7/0035* (2013.01); *G02F 1/133514* (2013.01); *G02F 2001/133519* (2013.01)

(58) Field of Classification Search
CPC combination set(s) only.
See application file for complete search history.

(56) References Cited

U.S. PATENT DOCUMENTS 7,646,465 B2 * 1/2010 Son et al. ............. 349/155
2005/0275768 A1 * 12/2005 Tsubata et al. ........ 349/106

* cited by examiner

*Primary Examiner* — Wen-Ying P Chen
(74) *Attorney, Agent, or Firm* — Andrew C. Cheng

(57) ABSTRACT

The present invention provides a color filter substrate, manufacturing method thereof and liquid crystal panel. The manufacturing method includes coating sequentially second photo-resist, third photo-resist and fourth photo-resist and performing respective exposure development to form RGB color-resist layer and form at least a protruding column on the BM layer; wherein the protruding column being formed by at least one of the three exposure developments; and forming common electrode layer covering RGB color-resist layer and the protruding column exceeding above top surface of the common electrode layer. As such, the present invention reduces the number of required lithography processes, simplifies the manufacturing process of color filter substrate and liquid crystal panel so as to reduce manufacturing cost.

13 Claims, 8 Drawing Sheets

COLOR FILTER SUBSTRATE, MANUFACTURING METHOD THEREOF AND LIQUID CRYSTAL PANEL

BACKGROUND OF THE INVENTION

1. Field of the Invention

The present invention relates to the field of liquid crystal displaying techniques, and in particular to a color filter substrate, manufacturing method thereof and liquid crystal panel.

2. The Related Arts

Currently, the liquid crystal display device usually uses vertical alignment (VA) wide-angle panel. The VA panels usually include patterned vertical alignment (PVA) and multi-domain vertical alignment (MVA) types. The difference between the two types is that the PVA type uses Indium Tin Oxide (ITO) electrode layer to replace the liquid crystal layer bumps in MVA. Because the transparent. ITO electrode layer can reduce the waste of backlight source to a maximum level, the liquid crystal panel using such technique has the advantages of high aperture ratio and large brightness contrast. In addition, the PVA-based liquid crystal panel has an overall quality better than the MVA-based liquid crystal panel. Therefore, PVA technique becomes the mainstream of the VA panel technique.

The known technique usually requires five lithography processes to complete the manufacturing of the color filter substrate, i.e., black matrix (BM) process, red (R) process, green (G) process, blue (B) process and photo spacer (PS) process, wherein the PS process forming the photo spacer to support two layers of glass substrates and serve as gap for controlling liquid crystal cell process. Because the above five lithography processes all requires photo-resist coating, baking, exposure, developing and washing and then drying, the manufacturing process of panel is complicated and takes long time, which leads to high manufacturing cost.

In summary, it is imperative to devise a method to reduce the lithography process of liquid crystal panel. Thus, the present invention provides a color filter substrate, manufacturing method thereof and liquid crystal panel that overcomes the above problems.

SUMMARY OF THE INVENTION

The technical issue to be addressed by the present invention is to provide a color filter substrate, manufacturing method thereof and liquid crystal panel, to reduce the number of lithography processes required for manufacturing and simplify the manufacturing process of color filter substrate and liquid crystal panel to reduce the manufacturing cost.

The present invention provides a method of manufacturing color filter substrate, which comprises: providing a substrate; coating a first photo-resist on the substrate and performing exposure development on the first photo-resist to form a black matrix (BM) layer surrounding a plurality of divided areas; coating sequentially a second photo-resist, a third photo-resist and a fourth photo-resist and performing respective exposure development to form RGB color-resist layer in divided areas and form at least a protruding column on the BM layer; wherein the protruding column being formed by at least one of the three exposure developments; and forming common electrode layer on the substrate, the common electrode layer covering the RGB color-resist layer and the protruding column exceeding above top surface of the common electrode layer.

According to a preferred embodiment of the present invention, the step of coating sequentially a second photo-resist, a third photo-resist and a fourth photo-resist and performing respective exposure development to form RGB color-resist layer in divided areas and form at least a protruding column on the BM layer further comprises: coating a second photo-resist on the substrate and performing exposure development on the second photo-resist to form a first red color-resist layer on the divided areas of the substrate and form at least a second red color-resist layer on the BM layer; coating a third photo-resist on the substrate and performing exposure development on the third photo-resist to form a first green color-resist layer on the divided areas of the substrate and form at least a second green color-resist layer on the second red color-resist layer; coating a fourth photo-resist on the substrate and performing exposure development on the fourth photo-resist to form a first blue color-resist layer on the divided areas of the substrate and form at least a second blue color-resist layer on the second green color-resist layer; the stacked second red color-resist layer, second green color-resist layer and second blue color-resist layer form the protruding column; the first red color-resist layer, the first green color-resist layer and the first blue color-resist layer are located in different divided areas.

According to a preferred embodiment of the present invention, the step of farming common electrode layer an the substrate, the common electrode layer covering the RGB color-resist layer and the protruding column exceeding above top surface of the common electrode layer further comprises: coating the common electrode layer on the substrate; performing patterning process on the common electrode layer so that the protruding column exceeding above top surface of the common electrode layer, and exposing top surface of the BM layer not disposed with protruding column.

According to a preferred embodiment of the present invention, the protruding column has a vertical cross-section shaped as a right ladder or rectangle.

According to a preferred embodiment of the present invention, the protruding column has a maximum width less than the width of the corresponding BM layer.

The present invention provides a color filter substrate, which comprises: a substrate, a black matrix (BM) layer, an RGB color-resist layer, a common electrode layer and at least a protruding column; the BM layer and the RGB color-resist layer being formed on a surface of same side of the substrate, the protruding column being disposed on the BM layer and being formed by at least one of three exposure developments forming the RGB color-resist layer; the common electrode layer covering the RGB color-resist layer and the protruding column exceeding top surface of the common electrode layer.

According to a preferred embodiment of the present invention, the RGB color-resist layer comprises a first color-resist layer, a second color-resist layer and a third color-resist layer; the protruding column is formed by one of the first color-resist layer, second color-resist layer and third color-resist layer or by stacking two or more of the first color-resist layer, second color-resist layer and third color-resist layer.

According to a preferred embodiment of the present invention, the protruding column has a vertical cross-section shaped as a right ladder or rectangle.

According to a preferred embodiment of the present invention, the protruding column has a maximum width less than the width of the corresponding BM layer.

According to a preferred embodiment of the present invention, the materials for the first color-resist layer, second color-resist layer and third color-resist layer are red pixel resin, green pixel resin and blue pixel resin respectively, and the common electrode layer is made of ITO.

The present invention provides a liquid crystal panel, which comprises: a color filter substrate and an array substrate, disposed oppositely, wherein the color filter substrate further comprising: a substrate, a black matrix (BM) layer, an RGB color-resist layer, a common electrode layer and at least a protruding column; the BM layer and the RGB color-resist layer being formed on a surface of same side of the substrate, the protruding column being disposed on the BM layer and being formed by at least one of three exposure developments forming the RGB color-resist layer; the common electrode layer covering the RGB color-resist layer and the protruding column exceeding top surface of the common electrode layer.

According to a preferred embodiment of the present invention, the protruding column contacts the array substrate, and a gap exists between the top surface of the common electrode layer and the array substrate.

According to a preferred embodiment of the present invention, the RGB color-resist layer comprises a first color-resist layer, a second color-resist layer and a third color-resist layer; the protruding column is formed by one of the first color-resist layer, second color-resist layer and third color-resist layer or by stacking two or more of the first color-resist layer, second color-resist layer and third color-resist layer.

According to a preferred embodiment of the present invention, the materials for the first color-resist layer, second color-resist layer and third color-resist layer are red pixel resin, green pixel resin and blue pixel resin respectively, and the common electrode layer is made of ITO.

The efficacy of the present invention is that to be distinguished from the state of the art. When forming RGB color-resist layer in the divided areas surrounded by BM layer on the color filter, the present invention also forms at least a protruding column on the BM layer, wherein the protruding column is formed by at least one of three exposure developments forming the RGB color-resist layer exceeds top surface of the common electrode layer. As such, the protruding column, formed by the three exposure developments forming the RGB color-resist layer in the present invention, is used to replace the photo spacer to eliminate the PS process so as to reduce the number of the required lithography processes and simplify the manufacturing process of color filter substrate and liquid crystal panel to reduce manufacturing cost.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

The present invention provides a color filter substrate, manufacturing method thereof and liquid crystal panel. Specifically, the method of manufacturing color filter substrate of the present invention uses the protruding column, formed by the three exposure developments forming the RGB color-resist layer, to replace the photo spacer to eliminate the PS process.

The following refers to FIGS. 1-7 and embodiments to describe the present invention in details.

Step S10: providing a substrate.

Figure 1:
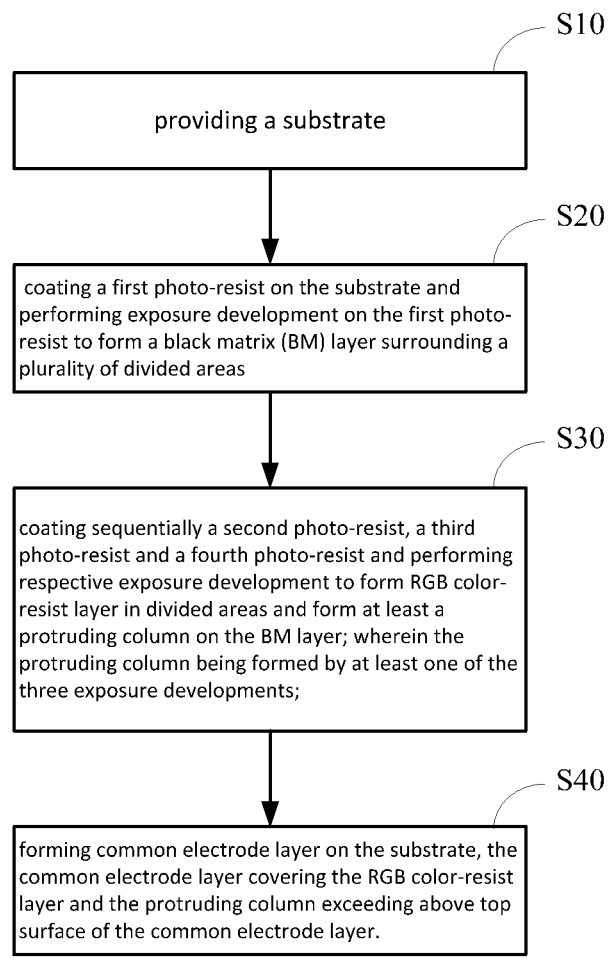
FIG. 1 is a flowchart of an embodiment of the method of manufacturing color filter substrate according to the present invention.
Figure 2:
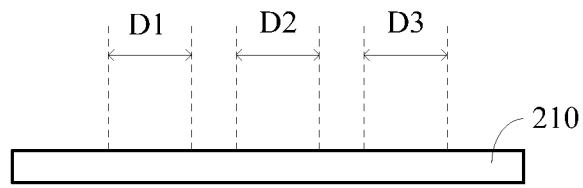
FIG. 2 is schematic view showing the structure of the color filter substrate according to the present invention.

FIG. 2 shows a schematic view of the structure of the substrate of the present invention. As shown in FIG. 2, the substrate 210 can be glass substrate, plastic substrate or flexible substrate, and is disposed with a plurality of divided areas D1, D2, D3, and so on, with selective transmittance.

Step S20: coating a first photo-resist on the substrate and performing exposure development on the first photo-resist to form a black matrix (BM) layer surrounding the plurality of divided areas.

Figure 3:
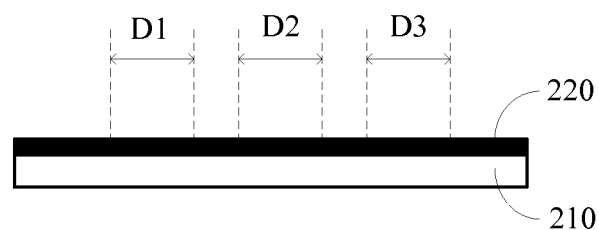
FIG. 3 is a schematic view showing the formation of BM layer on the color filter substrate according to the present invention.
Figure 3:
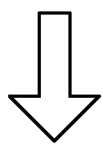
Figure 3:
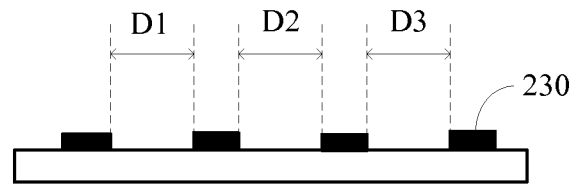

FIG. 3 is a schematic view showing the formation of BM layer on the color filter substrate according to the present invention. As shown in FIG. 3, the first photo-resist 220 is coated evenly on the substrate 210. Then, vacuum drying, removal of boundary photo-resist, pre-baking and cooling, exposure development and re-baking are performed on the substrate 210 coated with the first photo-resist 220 to form the BM layer 230 surrounding the divided areas S1, D2, D3, and so on.

Step S30: coating sequentially a second photo-resist, a third photo-resist and a fourth photo-resist and performing respective exposure development to form RGB color-resist layer in divided areas and form at least a protruding column on the BM layer; wherein the protruding column being formed by at least one of the three exposure developments.

Figure 4:
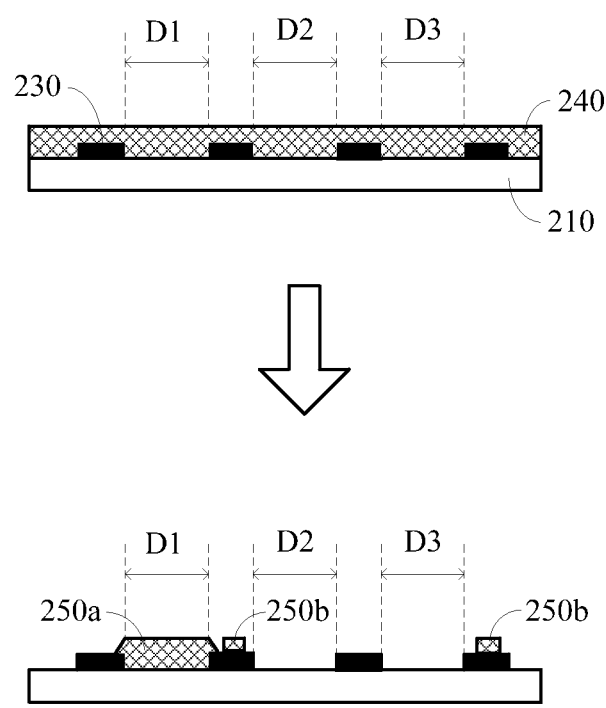
FIG. 4 is a schematic view showing the formation of the first red color-resist layer and the second red color-resist layer on the color filter substrate according to the present invention.

Referring to FIG. 4, after forming the BM layer 230, the second photo-resist 240 is coated on the substrate 210. Then, vacuum drying, removal of boundary photo-resist, pre-baking and cooling, exposure development and re-baking are performed on the substrate 210 coated with the second photo-resist 240 to form a first red color-resist layer 250a on divided area D1, and form at least a second red color-resist layer 250b on the BM layer 230.

Figure 5:
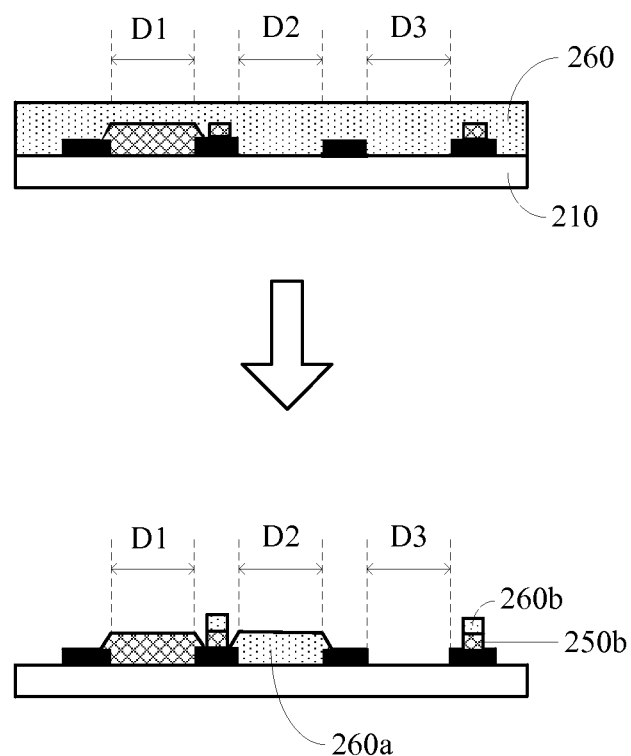
FIG. 5 is a schematic view showing the formation of the first green color-resist layer and the second green color-resist layer on the color filter substrate according to the present invention.

Referring to FIG. 5, after forming the first red color-resist layer 250a, the third photo-resist 260 is coated on the substrate 210. Then, vacuum drying, removal of boundary photo-resist, pre-baking and cooling, exposure development and re-baking are performed on the substrate 210 coated with the third photo-resist 260 to form a first green color-resist layer 260a on divided area D2, and form at least a second green color-resist layer 260b on the second red color-resist layer 250b.

Figure 6:
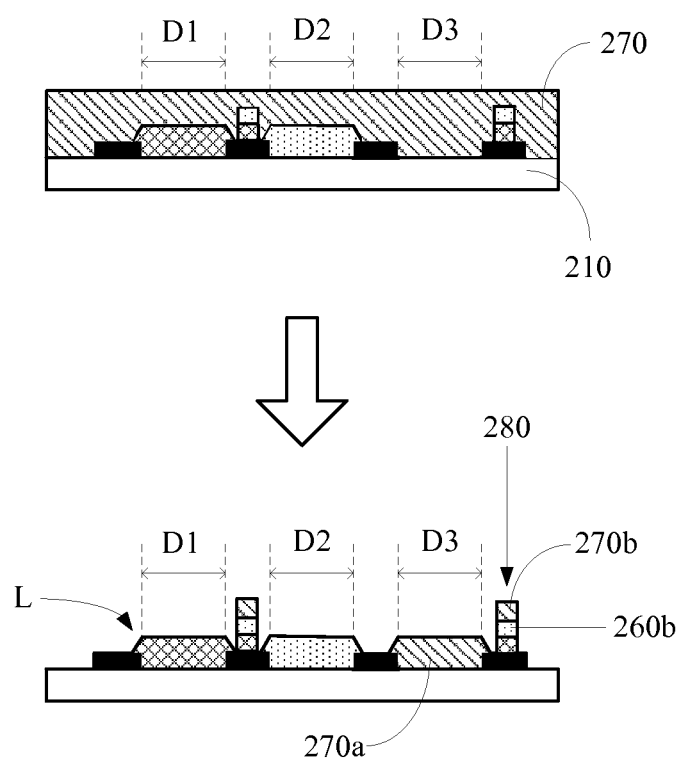
FIG. 6 is a schematic view showing the formation of the first blue color-resist layer and the second blue color-resist layer on the color filter substrate according to the present invention.

Referring to FIG. 6, after forming the first green color-resist layer 260a, the fourth photo-resist 270 is coated on the substrate 210. Then, vacuum drying, removal of boundary photo-resist, pre-baking and cooling, exposure development and re-baking are performed on the substrate 210 coated with the fourth photo-resist 270 to form a first blue color-resist layer 270a on divided area D3, and form at least a second blue color-resist layer 270b on the second green color-resist layer 260b.

In the instant embodiment, the stacked second red color-resist layer 250b, second green color-resist layer 260b and second blue color-resist layer 270b form the protruding column 280. The first red color-resist layer 250a, the first green color-resist layer 260a and the first blue color-resist layer 270a are located in different, and yet adjacent, divided areas D1, D2, D3, and so on, to form the RGB color-resist layer L of the color filter substrate.

It is noted that in the instant embodiment, the second red color-resist layer 250b, second green color-resist layer 260b and second blue color-resist layer 270b can have the same or different thickness, depending on the designs, as shown in FIG. 6.

In addition, in the three exposure developments forming the RGB color-resist layer L, the first red color-resist layer 250a and the second red color-resist layer 250b have the same thickness, the first green color-resist layer 260a and the second green color-resist layer 260b have the same thickness, and the first blue color-resist layer 270a and the second blue color-resist layer 270b have the same thickness.

In other embodiments, three half tone techniques can be used to form on the BM layer 230, wherein the first red color-resist layer 250a and the second red color-resist layer 250b have different thickness, the first green color-resist layer 260a and the second green color-resist layer 260b have different thickness, and the first blue color-resist layer 270a and the second blue color-resist layer 270b have different thickness.

In general, the half tone technique comprises: using half transmittance mask to perform half exposure, i.e., half grayscale mask technique. Prior to exposure, design the manufacturing data into an exposure data diagram. Then, the mask is disposed and the exposure is performed on the mask according to the exposure data diagram. After exposure, a lithography step and an etching step are performed, followed by subsequent mask washing and asking process.

By using the half tone technique, an exposure process can result in three levels of exposure, i.e., required to be exposed, half exposed and non-exposed, and forming photo-resist of two different thicknesses.

Step S40: forming common electrode layer on the substrate, the common electrode layer covering the RGB color-resist layer and the protruding column exceeding above top surface of the common electrode layer.

Figure 7:
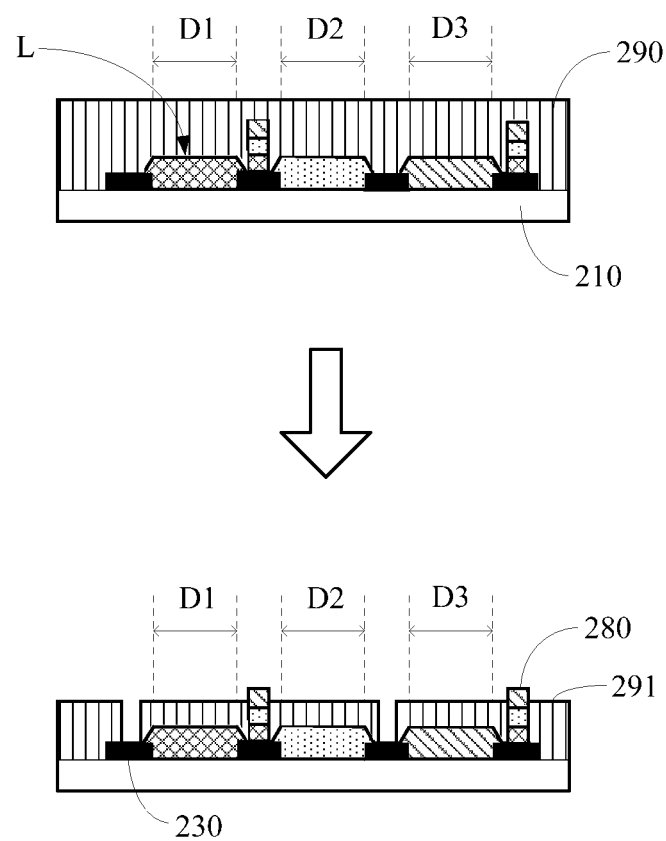
FIG. 7 is a schematic view showing the formation of the common electrode layer on the color filter substrate according to the present invention.

Referring to FIG. 7, after forming RGB color-resist layer L, a common electrode layer 290 is coated on the substrate 210, and a patterning process is performed on the common electrode layer 290 so that the protruding column 280 exceeds the top surface 291 of the common electrode layer 290 and the top surface of the BM layer 230 not disposed with the protruding column 280 is exposed. In the instant embodiment, the material for the common electrode layer 280 is ITO.

In summary, the present invention forms at least a protruding column 280 by at least one of three exposure developments forming the RGB color-resist layer and the protruding column 280 exceeds top surface 291 of the common electrode layer 290. As such, the protruding column 280 is used to replace the photo spacer to eliminate the PS process so as to reduce the number of the required lithography processes and simplify the manufacturing process of color filter substrate and liquid crystal panel to reduce manufacturing cost.

It is noted that in the present invention, the order of forming the RGC color-resist layer L and the corresponding stacked protruding column 280 can be varied. In other words, when forming the RGC color-resist layer L, the substrate 210 can be first coated with the second photo-resist 240 to form the first blue color-resist layer 270a and the second blue color-resist layer 270b, followed by forming the first red color-resist layer 250a and the second red color-resist layer 250b and then followed by forming first green color-resist layer 260a and the second green color-resist layer 260b.

In addition, it should be noted that other embodiments are also possible. For example, one or two exposure developments are selected from the three exposure developments forming the RGB color-resist layer L to use the mask exposure to control the shape of the color-resist stack formed on the BM layer to achieve the purpose of controlling the height of the protruding column by using the number of stacks of the color-resist layer.

Figure 8:
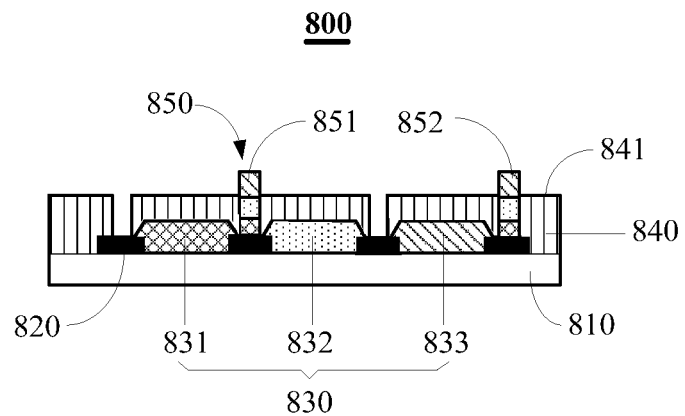
FIG. 8 is a schematic view showing the structure of an embodiment of the color filter substrate according to the present invention.

FIG. 8 is a schematic view showing the structure of an embodiment of the color filter substrate according to the present invention. As shown in FIG. 8, the color filter substrate 800 of the present embodiment comprises: a substrate 810, a BM layer 820, an RGB color-resist layer 830 a common electrode layer 840 and protruding columns 850.

In the instant embodiment, the BM layer 820 and the RGB color-resist layer 830 are formed on the surface of the same side on the substrate 810, wherein the RGB color-resist layer 830 further comprises a first color-resist layer 831, a second color-resist layer 832 and a third color-resist layer 833.

The protruding columns 850 comprise a first protruding column 851 and a second protruding column 852. The protruding columns 850 are disposed on the BM layer 820 and are formed by at least one of the three exposure developments forming the RGB color-resist layer 830. In other words, the protruding columns 850 are formed by one of the first color-resist layer 831, second color-resist layer 832 and third color-resist, layer 833, or by stacking two or more of the first color-resist layer 831, second color-resist layer 832 and third color-resist layer 833.

Figure 9:
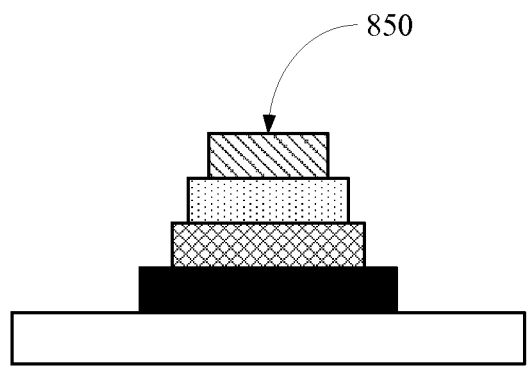
FIG. 9 is a schematic view showing the structure of protruding column of another embodiment of the color filter substrate according to the present invention.

In the instant embodiment, the protruding columns 850 have a vertical cross-section shaped as a right ladder, as shown in FIG. 9, rectangle or other shapes satisfying the requirements. To prevent light leakage during displaying, the protruding columns 850 have a maximum width less than the width of the corresponding BM layer 820. It should be noted that the number of protruding columns 850 is not restricted to two, as shown in FIG. 8. One ore more can be disposed based on the application requirement.

The common electrode layer 840 covers the RGB color-resist layer 830, and the protruding columns 850 are higher than the top surface 841 of the common electrode layer 841.

In the instant embodiment, the materials for the first color-resist layer 831 second color-resist layer 832 and third color-resist layer 833 are red pixel resin, green pixel resin and blue pixel resin respectively, and the common electrode layer 840 is made of ITO. In the instant embodiment, the manufacturing method of color filter substrate 800 is the same as the previous embodiment, and the description is omitted here.

Figure 10:
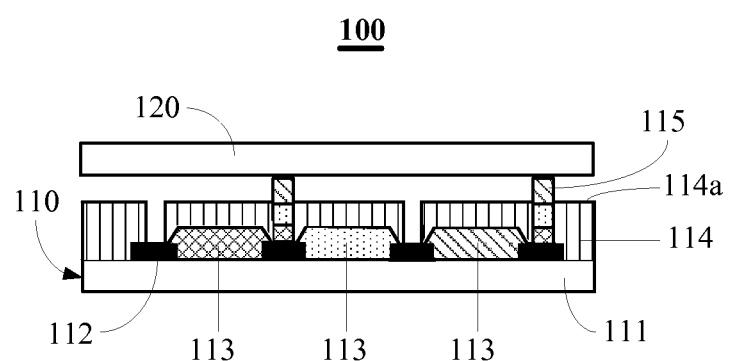
FIG. 10 is a schematic view showing the structure of an embodiment of a liquid crystal panel according to the present invention.

FIG. 10 is a schematic view showing the structure of an embodiment of a liquid crystal panel according to the present invention. As shown in FIG. 10, the liquid crystal panel 100 of the instant embodiment comprises: a color filter substrate 110 and an array substrate, disposed oppositely. The color filter substrate 110 further comprises a substrate 111, a BM layer 112, an RGB color-resist layer 113, a common electrode layer 114 and protruding columns 115.

The structure of the color filter substrate 110 in the instant embodiment is the same as the color filter substrate of the previous embodiment, and the description is omitted here.

It should be noted that in the instant embodiment, the protruding columns 115 contact the array substrate 120, and a gap exists between the top surface 114a of the common electrode layer 114 and the array substrate 120.

In summary, when forming RGB color-resist layer in the divided areas surrounded by BM layer on the color filter, the present invention also forms at least a protruding column on the BM layer, wherein the protruding column is formed by at least one of three exposure developments forming the RGB color-resist layer exceeds top surface of the common electrode layer. As such, the protruding column, formed by the three exposure developments forming the RGB color-resist layer in the present invention, is used to replace the photo spacer to eliminate the PS process so as to reduce the number of the required lithography processes and simplify the manufacturing process of color filter substrate and liquid crystal panel to reduce manufacturing cost.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A method of manufacturing color filter substrate, which comprises: providing a substrate;
    coating a first photo-resist on the substrate and performing exposure development on the first photo-resist to form a black matrix (BM) layer surrounding a plurality of divided areas;
    coating sequentially a second photo-resist, a third photo-resist and a fourth photo-resist and performing respective exposure development to form RGB color-resist layer in divided areas and form at least a protruding column on the BM layer; wherein the protruding column being formed by at least one of the three exposure developments; and
    coating a common electrode layer on the substrate, the common electrode layer covering the RGB color-resist layer and the protruding column exceeding above top surface of the common electrode layer; and
    performing a patterning process on the common electrode layer so that the protruding column exceeding above top surface of the common electrode layer, and exposing top surface of the BM layer not disposed with protruding column.

2. The method of manufacturing color filter substrate as claimed in claim 1, characterized in that the step of coating sequentially a second photo-resist, a third photo-resist and a fourth photo-resist and performing respective exposure development to form RGB color-resist layer in divided areas and form at least a protruding column on the BM layer further comprises:
    coating a second photo-resist on the substrate and performing exposure development on the second photo-resist to form a first red color-resist layer on the divided areas of the substrate and form at least a second red color-resist layer on the BM layer;
    coating a third photo-resist on the substrate and performing exposure development on the third photo-resist to form a first green color-resist layer on the divided areas of the substrate and form at least a second green color-resist layer on the second red color-resist layer; and
    coating a fourth photo-resist on the substrate and performing exposure development on the fourth photo-resist to form a first blue color-resist layer on the divided areas of the substrate and form at least a second blue color-resist layer on the second green color-resist layer; the stacked second red color-resist layer, second green color-resist layer and second blue color-resist layer form the protruding column; the first red color-resist layer, the first green color-resist layer and the first blue color-resist layer are located in different divided areas.

3. The method of manufacturing color filter substrate as claimed in claim 1, characterized in that the protruding column has a vertical cross-section shaped as a right ladder or rectangle.

4. The method of manufacturing color filter substrate as claimed in claim 3, characterized in that the protruding column has a maximum width less than the width of the corresponding BM layer.

5. A color filter substrate, which comprises: a substrate, a black matrix (BM) layer, an RGB color-resist layer, a common electrode layer and at least a protruding column; the BM layer and the RGB color-resist layer being formed on a surface of same side of the substrate, the protruding column being disposed on the BM layer and being formed by at least one of three exposure developments forming the RGB color-resist layer; the common electrode layer covering the RGB color-resist layer and the protruding column exceeding top surface of the common electrode layer, and a top surface of the BM layer not disposed with the protruding column being exposed from the common electrode layer.

6. The color filter substrate as claimed in claim 5, characterized in that the RGB color-resist layer comprises a first color-resist layer, a second color-resist layer and a third color-resist layer; the protruding column is formed by one of the first color-resist layer, second color-resist layer and third color-resist layer or by stacking two or more of the first color-resist layer, second color-resist layer and third color-resist layer.

7. The color filter substrate as claimed in claim 6, characterized in that the protruding column has a vertical cross-section shaped as a right ladder or rectangle.

8. The color filter substrate as claimed in claim 7, characterized in that the protruding column has a maximum width less than the width of the corresponding BM layer.

9. The color filter substrate as claimed in claim 5, characterized in that the materials for the first color-resist layer, second color-resist layer and third color-resist layer are red pixel resin, green pixel resin and blue pixel resin respectively, and the common electrode layer is made of ITO.

10. A liquid crystal panel, which comprises: a color filter substrate and an array substrate, disposed oppositely, wherein the color filter substrate further comprising: a substrate, a black matrix (BM) layer, an RGB color-resist layer, a common electrode layer and at least a protruding column; the BM layer and the RGB color-resist layer being formed on a surface of same side of the substrate, the protruding column being disposed on the BM layer and being formed by at least one of three exposure developments forming the RGB color-resist layer; the common electrode layer covering the RGB color-resist layer and the protruding column exceeding top surface of the common electrode layer, and a top surface of the BM layer not disposed with the protruding column being exposed from the common electrode layer.

11. The liquid crystal panel as claimed in claim 10, characterized in that the protruding column contacts the array substrate, and a gap exists between the top surface of the common electrode layer and the array substrate.

12. The liquid crystal panel as claimed in claim 10, characterized in that the RGB color-resist layer comprises a first color-resist layer, a second color-resist layer and a third color-resist layer; the protruding column is formed by one of the first color-resist layer, second color-resist layer and third color-resist layer or by stacking two or more of the first color-resist layer, second color-resist layer and third color-resist layer.

13. The liquid crystal panel as claimed in claim 12, characterized in that the materials for the first color-resist layer, second color-resist layer and third color-resist layer are red pixel resin, green pixel resin and blue pixel resin respectively, and the common electrode layer is made of ITO.

* * * * *